United States Patent
Parra et al.

(10) Patent No.: US 7,917,336 B2
(45) Date of Patent: Mar. 29, 2011

(54) GEOMETRIC SOURCE SEPARATION SIGNAL PROCESSING TECHNIQUE

(75) Inventors: Lucas Cristobal Parra, New York, NY (US); Christopher Vincent Alvino, Allenwood, NJ (US); Clay Douglas Spence, Princeton Junction, NJ (US); Craig Langdale Fancourt, Lawrenceville, NJ (US)

(73) Assignee: Thomson Licensing, Boulogne-Billancourt (FR)

( * ) Notice: Subject to any disclaimer, the term of this patent is extended or adjusted under 35 U.S.C. 154(b) by 316 days.

(21) Appl. No.: 10/470,498

(22) PCT Filed: Jan. 17, 2002

(86) PCT No.: PCT/US02/01113
§ 371 (c)(1),
(2), (4) Date: Jul. 29, 2003

(87) PCT Pub. No.: WO02/061732
PCT Pub. Date: Aug. 8, 2002

(65) Prior Publication Data
US 2004/0072336 A1    Apr. 15, 2004

Related U.S. Application Data

(60) Provisional application No. 60/264,924, filed on Jan. 30, 2001.

(51) Int. Cl.
*G06F 19/00* (2006.01)
(52) U.S. Cl. .......................... 702/190; 702/196
(58) Field of Classification Search .............. 702/57, 702/66, 75–77, 150–153, 189, 190, 194, 702/196, 197
See application file for complete search history.

(56) References Cited

U.S. PATENT DOCUMENTS

| | | | | |
|---|---|---|---|---|
| 4,908,865 A | * | 3/1990 | Doddington et al. | 704/241 |
| 4,931,977 A | * | 6/1990 | Klemes | 702/195 |
| 5,444,451 A | * | 8/1995 | Johnson et al. | 342/453 |
| 5,519,814 A | * | 5/1996 | Rodriguez et al. | 700/264 |
| 5,610,991 A | * | 3/1997 | Janse | 381/92 |
| 5,949,678 A | * | 9/1999 | Wold et al. | 700/83 |

(Continued)

FOREIGN PATENT DOCUMENTS

| WO | 99/52211 | 10/1999 |
|---|---|---|
| WO | WO 9952211 A1 * | 10/1999 |

OTHER PUBLICATIONS

Parra et al., "Convolutive Blind Source Separation based on Multiple Decorrelation", Neural Networks for Signal Processing VIII, 1998. Proceedings of the 1998 IEEE Signal Processing Society Workshop, Aug. 31-Sep. 2, 1998 pp. 23-32.*

(Continued)

*Primary Examiner* — Jeffrey R West
(74) *Attorney, Agent, or Firm* — Robert D. Shedd; Joseph J. Opalach; Catherine A. Cooper

(57) ABSTRACT

A computer system that processes mixtures of signals, such as speech and noise sources derived from multiple simultaneous microphone recordings, in order to separate them into their underlying sources. A source separation routine optimizes a filter structure by minimizing cross powers of multiple output channels while enforcing geometric constraints on the filter response. The geometric constraints enforce desired responses for given locations of the underlying sources, based on the assumption that the sources are localized in space.

15 Claims, 2 Drawing Sheets

U.S. PATENT DOCUMENTS

| | | | | |
|---|---|---|---|---|
| 6,167,417 | A * | 12/2000 | Parra et al. | 708/405 |
| 6,185,309 | B1 * | 2/2001 | Attias | 381/94.1 |
| 6,202,033 | B1 * | 3/2001 | Lange | 702/104 |
| 6,317,703 | B1 * | 11/2001 | Linsker | 702/190 |
| 6,430,528 | B1 * | 8/2002 | Jourjine et al. | 704/200 |
| 6,526,148 | B1 * | 2/2003 | Jourjine et al. | 381/94.7 |
| 6,625,587 | B1 * | 9/2003 | Erten et al. | 706/22 |
| 6,845,164 | B2 * | 1/2005 | Gustafsson | 381/94.1 |
| 6,898,612 | B1 * | 5/2005 | Parra et al. | 708/405 |

OTHER PUBLICATIONS

Kopriva et al., "Discrimination of optical sources by use of adaptive blind source separation theory", Applied Optics, vol. 37, No. 7. Mar. 1, 1999.*

Li. et al, "Comparison of Blind Source Separation Algorithms", Advances in Neural Networks and Applications, WSES, 2000, p. 18-21.*

Parra, "An Introduction to Independent Component Analysis and Blind Source Separation", Apr. 25, 1999.*

Wu et al., "Exploring the time-frequency microstructure of speech for blind source separation" Intl. Conf. on Acoustics, Speech, and Signal Processing, pp. 1145-1148, at Piscataway, NJ, May 1998.*

Perlis, "Theory of Matrices", Dover Publications, Inc., New York, 1991.*

Hoang-Lang Nguyen Thi et al.: "Blind Source Seperation for Convolutive Mixtures", Signal Processing, vol. 45, No. 2, Mar. 30, 1995, pp. 209-229.

B.G. Agee: "Blind Separation and Capture of Communication Signals Using a Multitarget Constant Modulus Beamformer", MILCOM 89. IEEE Military Communications Conference, Boston, MA USA, vol. 2, Oct. 15-18, 1989, pp. 340-346.

L. Parra et al.: "Convolutive Blind Separation of Non-Stationary Sources" IEEE Transactions on Speech and Audio Processing, IEEE Inc. New York US, vol. 8, No. 3, May 2000, pp. 320-327.

L. Parra et al: "Geometric Source Separation: Merginging Convolutive Source Separation with Geometric Beamforming" Neural Networks for Signal Processing Xi: Proceedings of the 2001 IEEE Signal Processing Society Workshop (IEEE Cat. No. 01TH8584), pp. 273-282.

Another version of Reference AM, pp. 1-10 Reference AM provided with date of Sep. 10-12, 2001.

Search Report dated Jun. 25, 2002.

* cited by examiner

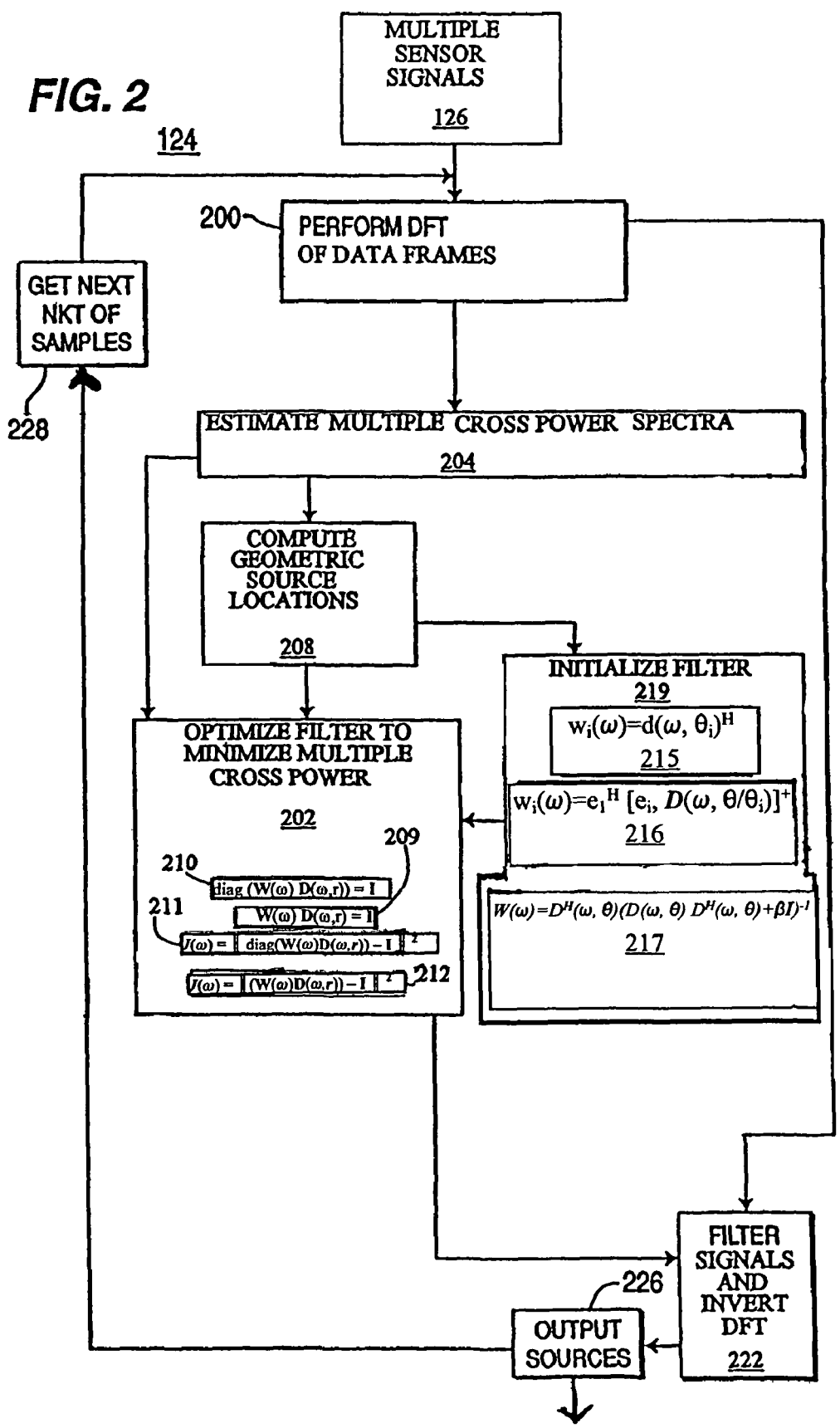

GEOMETRIC SOURCE SEPARATION SIGNAL PROCESSING TECHNIQUE

This application claims the benefit, under 35 U.S.C. §365 of International Application PCT/US02/01113, filed Jan. 17, 2002, which was published in accordance with PCT Article 21 (2) on Aug. 8, 2002 in English and which claims the benefit of U.S. patent application No. 60/264,9248, filed Jan. 30, 2001.

FIELD OF THE INVENTION

This invention pertains generally to signal processing and more specifically to a system for performing mixed signal separation using geometric information and adaptive beamforming techniques.

BACKGROUND OF THE INVENTION

Blind source separation refers to the process of separating a composite signal into its original component signals without prior knowledge of their characteristics. This process is useful in speech recognition, multipath channel identification and equalization, improvement of the signal to interference ratio (SIR) of acoustic recordings, in surveillance applications and in the operation of hearing aids.

Blind source separation of broad band signals in a multipath environment remains a difficult problem which has a number of ambiguities. Increasing the number of sensors allows improved performance but leads to ambiguities in the choice of the separating filters. There are in theory multiple filters that invert the responses in a room because there are multiple projections from the space containing microphone signals into the smaller space of signal sources. These multiple filters represent remaining degrees of freedom in terms of a sensor array response.

The consistent assignment of signal contributions to different source channels across different frequencies creates a frequency permutation problem. This problem is inherent to all source separation algorithms including time domain algorithms unless the algorithm simultaneously considers different frequency bands. An estimation of such polyspectral properties is particularly difficult for nonstationary signals such as speech and the resulting algorithms are computationally expensive.

The basic source separation problem is described by assuming the existence of M uncorrelated, time varying source signals source signals:

$$s(t) \in R^M$$

where R indicates the set of real numbers and the sources s(t) originate from different spatial locations. A number of sensors N (where $N \geq M$) detect time varying signals:

$$x(t) \in R^N.$$

In a multipath environment each source j couples with sensor i through a linear transfer function $A_{ij}(\tau)$, representing the impulse response of the corresponding source to sensor path such that:

$$x_i(t) = \sum_{j=1}^{M} \sum_{\tau=0}^{P-1} A_{ij}(\tau) s_j(t - \tau)$$

wherein P is the length of the impulse response of the environment, measured samples.

This equation can be rewritten using matrix notation (denoting the convolutions by *):

$$X(t) = A(t) * s(t).$$

After applying the discrete time Fourier transform, this equation may be rewritten as:

$$X(\omega) = A(\omega) s(\omega).$$

The goal of convolutive source separation is to find finite impulse response (FIR) filters $W_{ij}(\tau)$ that invert the effect of the convolutive mixing $A(\tau)$. This is equivalent to producing $$y(\omega) = W(\omega) x(\omega)$$

that correspond to the original sources s(t).

Different criteria for convolutive separation have been proposed, for example as discussed by H.-L. N. Thi and C. Jutten in "BLIND SOURCE SEPARATION FOR CONVOLUTIVE MIXTURES", published in Signal Processing, vol. 45, no. 2, pp. 209-229 (1995). A two channel example is disclosed in U.S. Pat. No. 5,208,786 entitled MULTI-CHANNEL SIGNAL SEPARATION, issued to Weinstein et al. The '786 patent models each channel as a multi-input-multi-output (MIMO) linear time invariant system. The input source signals are separated and recovered by requiring that the reconstructed signals be statistically uncorrelated. However, the decorrelation condition is insufficient to uniquely solve the problem unless one assumes that the unknown channel is a 2×2 MIMO finite impulse response filter.

All convolutive separation criteria can be derived from the assumption of statistical independence of the unknown signals, usually limited to pairwise independence of the source signals. Pairwise independence implies that all cross-moments can be factored, thereby creating a number of necessary conditions for the model signal sources, $$\forall t,n,m,\tau, i \neq j: E[y_i^n(t) y_j^m(t+\tau)] = E[y_i^n(t)] E[y_j^m(t+\tau)]. \quad \text{(Equation I)}$$

Convolutive separation requires that these conditions by satisfied for multiple delays X which correspond to the delays of the filter taps of $W(\tau)$. For stationary signals higher order criteria (multiple n, m) are required. For non-stationary signals such as speech multiple t can be used and multiple decorrelation (n=m=1) is sufficient.

When using an independence criterion there remains both a permutation and scaling ambiguity. In the convolutive case the scaling ambiguity applies to each frequency group or bin resulting in a convolutive ambiguity for each source signal in the time domain. Any delayed or convolved versions of independent signals remain independent. For the independent frequency domain $$E[y_i^n(\omega) y_j^m(\omega)] = E[y_i^n(\omega)] E[y_j^m(\omega)],$$

there is a permutation ambiguity per each frequency for all orders n and m. For each frequency the independent frequency domain is therefore also satisfied by arbitrary scaling and assignment of indices i, j to the model sources $$W(\omega) A(\omega) = P(\omega) S(\omega), \quad \text{(Equation II)}$$

where $P(\omega)$ represents an arbitrary permutation matrix and $S(\omega)$ an arbitrary diagonal scaling matrix for each frequency. This creates the problem that contributions of a given signal source may not be assigned consistently to a single model source for different frequency bins. A given model source will therefore have contributions from different actual sources. The problem is more severe with an increasing number of channels as the possible number of permutations increases.

This problem has often been considered an artifact of the frequency domain formulation of the separation criteria since the separation task is decoupled into independent separation tasks per frequency bin. For n=m=1 this ambiguity also applies to the time domain independence criteria set forth in Equation I. Even for higher orders the time domain criteria does not guarantee correct permutations.

Some source separation work in the past simply ignored the problem. Others have proposed a number of solutions such as continuity in the spectra of the model sources, or the fact that the different frequency bins are often co-modulated. A rigorous way of capturing these statistical properties of multiple frequency contributions are polyspectra. However, in practice it is difficult to obtain robust statistics at multiple frequencies, in particular for non-stationary signals such as speech. In addition, the algorithms that consider combinations of frequencies are inherently computationally very demanding. Smoothness constraints on the filter coefficients in the frequency domain have also been proposed, as for example in U.S. Pat. No. 6,167,417 entitled CONVOLUTIVE BLIND SOURCE SEPARATION USING A MULTIPLE DECORRELATION METHOD, issued to Parra et al. This is equivalent to constraining the length of the filter as compared to the size of the analysis window. However, this limitation on the filter size may not always be reasonable as rather long filters are required in strongly reverberant environments.

In theory only N sensors are needed to separate M=N sources. In practice, however, one may want to use more microphones (N>M) to improve the performance of a real system. Ignoring the permutation and scaling ambiguities, Equation II reads $W(\omega)A(\omega)=I$, where I represents the identity matrix. For a given A(w) there is a N–M dimensional linear space of solutions $W(\omega)$, indicating that there are additional degrees of freedom when shaping a beam pattern represented by the filters $W(\omega)$.

In conventional geometric and adaptive beamforming information such as microphone position and source location is often utilized. Geometric assumptions can be incorporated and implemented as linear constraints to the filter coefficients. In a multiple sidelobe canceler, for example, the response of one of the channels (channel i) is kept constant, which can be expressed as $w(\omega)e_i=$constant. The elements of the row vector $w(\omega) \in C^N$ are the filter elements to be applied to each microphone, and $e_i$ is the ith column of the identity matrix. This is similar to the normalization condition imposed on the diagonal terms of W that is conventionally applied in blind separation algorithms. Rather than constraining a channel one can also constrain the response of a beamformer for a particular orientation.

If the locations and response characteristics of each microphone is known, one can compute the free field response of a set of microphones and associated beam forming filters $w(\omega)$. For a position q, the phase and magnitude response is given by $$r(\omega,q)=w(\omega)d(\omega,q),$$

where $d(\omega,q) \in C^N$ represents the phase and magnitude response of the N microphones for a source located at q. For a linear array with omnidirectional microphones and a far field source (much beyond the array aperture squared over the wavelength of interest) the microphone response depends approximately only on the angle $\theta=\theta(q)$ between the source and the linear array, $$d(\omega,q)=d(\omega,\theta)=e^{-j\omega(p_i/c)sin(\theta)},$$

where $p_i$ is the position of the ith microphone on the linear array and c is the wave propagation speed.

Constraining the response to a particular orientation is simply expressed by the linear constraint on $w(\omega)$ such that $r(\omega,\theta)=w(\omega)d(\omega,\theta)=$constant. This concept is used in the linearly constrained minimum variance (LCMV) algorithm and is also the underlying idea for generalized sidelobe cancelling. In order to obtain a robust beam it has also been suggested to require a smooth response around a desired orientation. In summary, all of these conditions or a combination of them can be expressed as linear constraints on $w(\omega)$.

Most adaptive beamforming algorithms consider power as their main criteria for optimization. Sometimes power is minimized such as in noise or sidelobe cancelling in order to adaptively minimize the response at the orientation of the interfering signals. Sometimes power is maximized, as in matched filter approaches, to maximize the response of interest. As a result, these algorithms often perform suboptimally when there is cross talk from other sources.

In second order source separation methods rather than considering the power of an individual beam $w(\omega) \in C^{1 \times N}$ and an individual channel $y(t) \in R^1$, one can consider powers and cross powers of multiple beams $W(\omega) \in C^{M \times N}$ and their corresponding outputs $y(t) \in R^M$. In the frequency domain these multiple beams and outputs correspond to the cross power spectra $R_{yy}(t, \omega)$.

Second order blind source separation of nonstationary signals minimizes cross powers across multiple times. Off diagonal elements of the matrix $R_{yy}(t, \omega)$ are minimized in second order separation rather than the diagonal terms as is the case in the conventional adaptive beamforming. Strict one channel power criteria has a serious cross talk or leakage problem when multiple sources are simultaneously active, especially in reverberant environments.

SUMMARY OF THE INVENTION

The present invention addresses the need to separate the source of nonstationary broad band signals in a multipath environment. Ambiguities in source separation are addressed by adding prior information such as microphone position by adding the assumption that the sources are localized in space. By replacing the power criteria of many adaptive beamforming algorithms by a cross power criteria a plurality of geometric source separation algorithms are obtained. To address the permutation, convolution and more general degrees of freedom for the shaping of beams, geometric information is utilized. The advantages of blind source separation and geometric beamforming are combined by minimizing the cross power spectra for multiple times t while enforcing constraints used in conventional adaptive beamforming.

BRIEF DESCRIPTION OF THE DRAWINGS

FIG. 2 is a flow diagram of a method of the present invention;

DETAILED DESCRIPTION OF THE INVENTION

Figure 1:
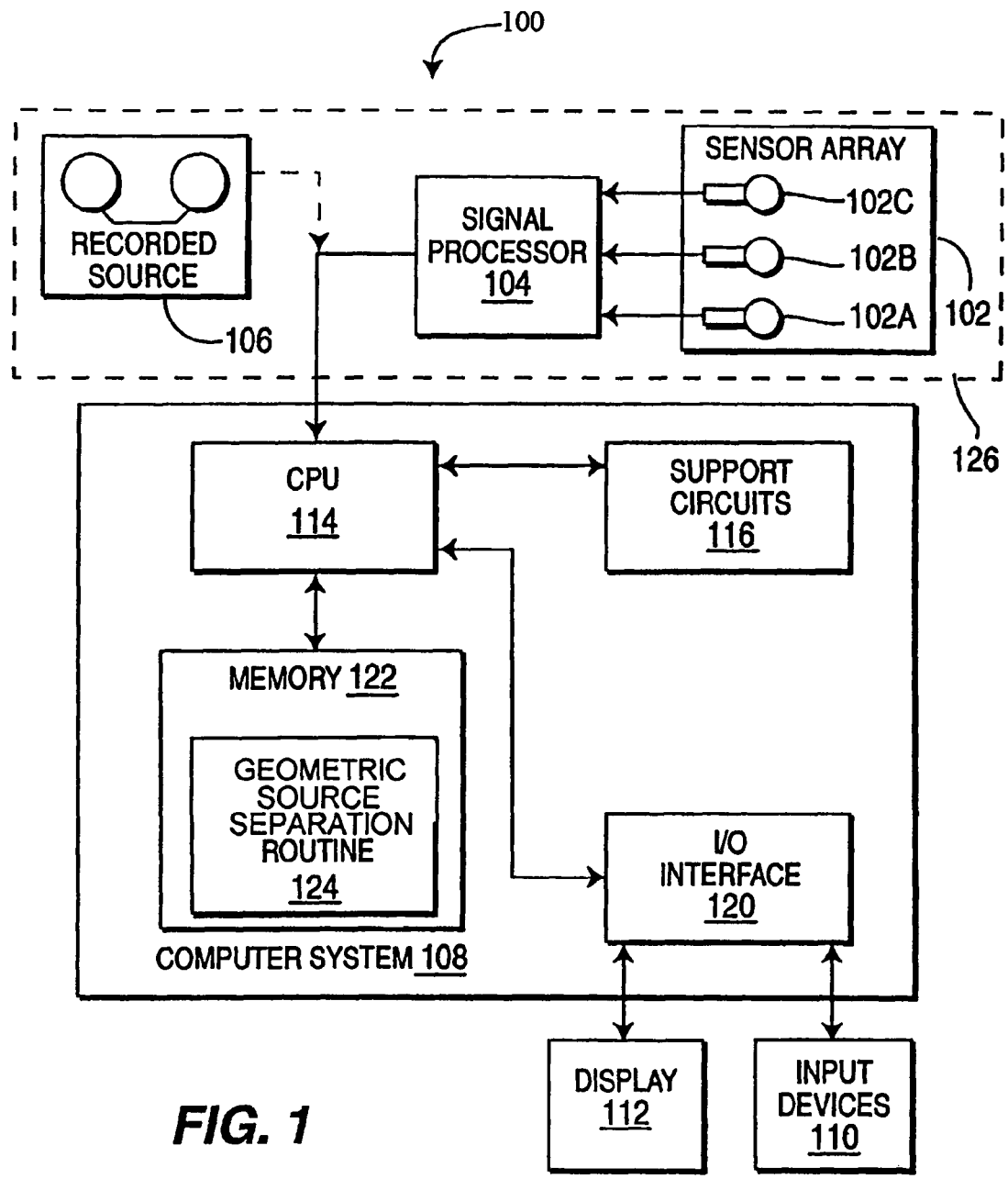
FIG. 1 depicts a system for executing a software implementation of the present invention.

The present invention estimates values of $W(\omega)$ obtained by known blind source separation techniques by making geometric assumptions regarding the signal sources. The sources are assumed to be localized at least up to the spatial resolution of a given array. The invention assumes that signals originate from the same locations for the entire frequency spectrum, permitting the formulation of geometric constraints on the filter coefficients. Different geometric constraints are introduced leading to a class of Geometric Source Separation algorithms.

FIG. 1 depicts a system 100 for implementing the source separation method of the present invention. The system 100 comprises a composite signal source 126 that supplies the signal that is to be separated into its component signals and a computer system 108 that executes the geometric source separation routine of the present invention. The source 126 may contain any source of composite signals, but is illustratively shown to contain a sensor array 102, a signal processor 104 and a recorded signal source 106. The sensor array contains one or more transducers 102A, 102B and 102C such as microphones. The transducers are coupled to a signal processor 104 that performs signal digitization. A digital signal is coupled to the computer system 108 for signal separation and further processing. A recorded signal source 106 may optionally form a source of the composite signals that require separation.

The computer system 108 comprises a central processing unit (CPU) 114, a memory 122, support circuits 116 and an input/output (I/O) interface 120. The computer system 108 is generally coupled through the I/O interface 120 to a display 112 and various input devices 110 such as a mouse and keyboard. The support circuits generally contain well known circuits such as cache, power supplies, clock circuits, a communications bus and the like. The memory 122 may include random access memory (RAM), read only memory (ROM), disk drive, tape drive and the like, or some combination of memory devices.

The invention is implemented as the geometric source separation routine 124 that is stored in memory 122 and executed by the CPU 114 to process the signal from the signal sources 126. As such the computer system 108 is a general purpose computer system that becomes a specific purpose computer system when executing the routine 124 of the present invention. Although a general purpose computer is illustratively shown as a platform for implementing the invention, the invention can also be implemented in hardware as an application specific integrated circuit (ASIC), a digital signal processing (D)SP) integrated circuit, or other hardware device or devices. As such, the invention may be implemented in software, hardware or a combination of software and hardware.

FIG. 2 depicts a flow diagram of the geometric source separation routine 124 of the present invention. At step 200, the composite, mixed signal 126 is input, the signal being separated into a plurality of data frames containing data samples of the input signal x(t). The routine 200 produces discrete Fourier transform (DFT) values x($\Omega$) for each data frame x(t), that is, one frequency domain DFT value for each window of length T samples.

At step 204, a running time estimate of $R_{yy}(t, \omega)$ is computed from the outputs y(t). As large T are required for typical filter sizes, simultaneous diagnolization of $R_{yy}(t, \omega)$ for multiple times t is preformed so as to minimize the sum of squares of the off diagonal elements according to the equation 213:

$$J(W) = \sum_{t,\omega} \alpha(\omega) \|R_{yy}(t, \omega) - diag(R_{yy}(t, \omega))\|^2.$$

Multiple times t is performed so as to minimize the sum of squares of the off diagonal elements according to the equation 213:

$$J(W) = \sum_{t,\omega} \alpha(\omega) \|R_{yy}(t, \omega) - diag(R_{yy}(t, \omega))\|^2,$$

with the factorization $R_{yy}(t, \omega) \approx W(\omega) R_{xx}(t, \omega) \| \ldots \|$ refers to the Frobenius norm defined as $\|M\|^2 = Tr(MM^H)$. The summations over t and $\omega$ will range over all time and all frequency bins for which adaptation of W will occur, respectively. For faster convergence using gradient descent the total input power per frequency $\alpha(\omega)$ is normalized, $$\alpha(\omega) = \sum_t \|R_{xx}(t, \omega)\|^{-2}.$$

Wherein $R_{xx}$ refers to the matrix of cross-power spectra of the microphone signals with each other analogous to $R_{yy}$. These values are computed form the microphone signals, rather than the output signals of the algorithm. This criteria is minimized with respect to the filter coefficients W. The lower bound of zero is obtained only if $R_{yy}(t, \omega)$ is diagonal.

The signal sources s(t) are localized at angles r=[$r_j \ldots r_m$] and at a sufficient distance from the sensors 102 for a far field approximation to apply. While full three dimensional source location can be advantageously used with the present invention, the specific embodiment described here will identify source locations simply by incident angle to the microphone array. Step 208 computes the geometric source locations based on the cross power spectra produced at step 204. Step 219 applies a selection or switch to determine which of various criteria will be next be applied to the cross power spectra calculation. For example, if the hard constraint 210

$$diag(W(\omega)D(\omega,r))=I$$

is applied to each filter $w_i(\omega)$, then the ith row vector in W($\omega$) is forced to have a unit response in the direction $\theta i$. D is the matrix obtained by placing side-by-side the column vectors d($\omega$,q). In a gradient descent algorithm constraint 210 can simply be implemented by projecting the gradient ($\delta J/\delta w_i(\omega)$) to the linear subspace of permissible solutions with a constrained gradient. Since power or cross power minimization will try to minimize the response at the interference angles, this will lead to an equivalent singularity at those frequencies. In those cases a soft constraint should be selected as a regularization term 211 of the form $$J_1(\omega) = \|diag(W(\omega)D(\omega,r)) - I\|^2.$$

A second, more restrictive hard constraint 209

$$W(\omega)D(\omega,r)=I$$

may be selected in step 219. Hard constraint 209 imposes the condition of hard constraint 210 to each filter $w_i(\omega)$ by forcing the ith row vector in W($\omega$) to have a unit response in the direction $\theta_i$. Further, the hard constraint 209 requires that the ith row vector have a zero response in the direction of interfering signals $\theta_j$ where i≠j.

At those frequencies where the grating lobes (periodic replica of the main lobes due to limited spatial sampling) of a beam pattern cross the interfering angles, D($\omega$,r) is not invertible. In those cases it is unreasonable to try to enforce constraint 209 as a hard constraint. Rather, soft constraint 212 is selected by adding the regularization term of the form $$J_2(\omega) = \|(W(\omega)D(\omega, r)) - I\|^2.$$

Step 219 performs various initialization conditions on equation 213. In all initializations the relationship $w_i(\omega)e_i = 1$ is required to normalize the scale during optimization. In step 215 the filter structure is initialized to correspond to a delay-sum beamformer pointing into the orientations of the individual sources (del-sum). Using the orientations $\theta_i$ the filter coefficients of the ith beam (the row vectors $w_i(\omega)$ of $W(\omega)$) are initialized with algorithm $$w_i(\omega)=d(\omega,\theta_i)^H.$$

wherein H represents the Hermitian conjugate.

In step 219 the equation 213 can alternatively be initialized with beams that place zeroes at all orientations of interfering sources, that is, at angles $\theta/\theta_i$ for the ith beam. The initialization filters with minimum norm that satisify those conditions can be computed explicitly with a least squares approach resulting in the initialization algorithm 216, $$w_i(\omega)=e_i^H[e_i,D(\omega,\theta/\theta_i)]^+,$$

where $^+$ indicates the psuedo-inverse and $[e_i,D(\omega,\theta/\theta_i)]$ is a matrix containing the ith column el of the unit matrix and all but the ith column of $D(\omega,\theta)$.

In an on line implementation of a separation algorithm the concept of introducing geometric information through an initialization is typically not feasible as the source positions in the environment may be changing dynamically. More frequently the geometric constraints are enforced at initialization and throughout the optimization process. The constraints change dynamically as the estimated locations change. The linear constraints 209 and 210 are each typically implemented as a soft constraint with a penalty term. The problem of noninvertibility is addressed by introducing a frequency dependent weighting of the penalty term. In particular the goal is to eliminate the constraints from the optimization for those frequency bands for which $D(\omega,\theta)$ is not inveritble. A rather straightforward metric for invertibility is the condition number. Therefore at steps 211 and 212 the regularization term J(W) is weighted with the the inverse of the condition number of $\lambda(\omega)=\text{cond}^{-1}(D(\omega,\theta))$, which converges to zero when $D(\omega,\theta)$ is not invertible and remains bounded otherwise, for example as $0 \leq \lambda(\omega) \leq 1$. The total cost function 218 including frequency dependent weighting of the geometric regularization term is given by $$J(W)+\lambda\sum_w \lambda(\omega)J_{2/1}W(\omega).$$

In algorithm 210 the regularization term $J_1$ will try to maintain the response of filters i in orientation $\theta_i$. The delay-sum beamformer 215 satisfies the condition of algorithm 210 strictly. In algorithm 209 the regularization term $J_2$ will in addition minimize the response for the orientations of the interfering sources. The filter structure that strictly guarantees the constraints of algorithm 209 are computed with a least squares approach as the psuedo inverse of $D^H(\omega,\theta)$, or by including a regularization term $\beta I$ for the noninvertibility problem, resulting in algorithm 217:

$$W(\omega)=D^H(\omega,\theta)(D(\omega,\theta)D^H(\omega,\theta)+\beta I)^{-1}.$$

Algorithm 217 minimizes its response at the angles of interfering sources, while its response in other directions is not specified. The results for algorithm 215, 210 and 209 exhibit a main lobe in the directions of the corresponding source. For conflicting frequency bands, where a grating lobe coincides with the location of an interfering source, multiple cross power minimization cancels the main lobe for algorithm 215, while conserving it somewhat for algorithms 210 and 209 due to the geometric penalty. Qualitatively, the results for the data independent algorithm 217 appears to capture both main lobe and zeros in the correct location. However, its performance is inferior to the data adaptive algorithms 209, 210, 215 and 216.

Any of the algorithms 209, 210, 211 and 212 can be used to optimize the signal filter 222 and minimize the cross power at step 202 using a gradient descent algorithm. The angles $\theta_i$ of the multiple sources can be identified automatically using the Multiple Signal Classification (MUSIC) algorithm, which is a method of computing directions of arrival of multiple signals using arbitrarily placed antennas with arbitrary directional responses. The MUSIC algorithm also applies to measuring frequencies of multiple sinusoids comprising a sampled data time series. When used to measure frequency it is directly suited to tapped delay line implementations. The number of sources M is assumed to be known. After the signal filter is optimized in step 222 the sources are output in step 226. Subsequently, the next set of data samples is acquired in step 228 and the process begins anew in step 200. While the examples and algorithms given in this description are directed toward numerical operations in the frequency domain, the present invention can also be implemented in the time domain.

The invention claimed is:

1. An apparatus for separating a convolutively mixed signal into a plurality of source signals comprising:
    a plurality of signal sensors, each sensor residing at a sensor location for sensing a source signal of the plurality of source signals at the sensor location and providing a sensor signal representing the sensed source signal;
    a multiple input, multiple output signal filter for filtering a convolutively mixed signal, said convolutively mixed signal comprising sensor signals from each of said plurality of signal sensors;
    means for estimating cross powers of multiple output channels, said cross power being estimated for each of the multiple output channels at multiple times;
    means for computing a set of source locations r of the plurality of source signals for use in constraining subsequent source separation, each source location of the set of source locations r being defined by spatial relation to the sensor locations;
    means for adapting the multiple input, multiple output signal filter to minimize the cross powers while enforcing a desired filter response for the set of source locations; and
    said multiple input, multiple output signal filter filtering the convolutively mixed signal in order to separate the convolutively mixed signal into said plurality of source signals, wherein said filtering utilizes said computed set of source locations r as a constraint in determining separation of the plurality of source signals.

2. The apparatus of claim 1 wherein the desired filter response is enforced by applying a regularization term when the multiple input, multiple output signal filter is minimizing multiple output powers.

3. The apparatus of claim 2 wherein the regularization term is defined as $$J_1(\omega)=\|\text{diag}(W(\omega)D(\omega,r))-I\|_F^2.$$

4. The apparatus of claim 2 wherein the regularization term is defined as $$J_2(\omega)=\|(W(\omega)D(\omega,r))-I\|_F^2.$$

5. The apparatus of claim 1 wherein the desired filter response is enforced by applying $$\text{diag}(W(\omega)D(\omega,r))=I.$$

6. The apparatus of claim 1 wherein the desired filter response is enforced by applying (W(ω)D(ω,r))=I.

7. The apparatus of claim 1 wherein the multiple input, multiple output signal filter is a finite impulse response filter.

8. The apparatus of claim 7, further comprising a memory containing spatial location data of sources of the convolutively mixed signal, said spatial location data being coupled to the finite impulse response filter.

9. The apparatus of claim 8, further comprising a geometric source separation module which accesses a plurality of algorithms adapted to compute a plurality of filter coefficients for the finite impulse response filter.

10. The apparatus of claim 1 wherein the cross power is minimized by implementing a minimizing cost function defined as $$J(W) = \sum_{t,\omega} \alpha(\omega) \| R_{yy}(t, \omega) - diag(R_{yy}(t, \omega)) \|_F^2.$$

11. The apparatus of claim 1 wherein each source location of the set of source locations r are specified by angles relative to one of said sensor locations.

12. The apparatus of claim 1 wherein the multiple input, multiple output signal filter is initialized to behave as a beam former filter, the initialized multiple input, multiple output signal filter representing a set of delay sum beamformers aiming at the set of source locations r.

13. The apparatus of claim 1 wherein the set of source locations r are estimated from cross power spectra.

14. A method of separating a composite signal into a plurality of component signals comprising the steps of computing a cross power spectra $R_{yy}(t,\omega)$ of the plurality of component signals, simultaneously diagonalizing $R_{yy}(t,\omega)$ with an algorithm defined as:

$$J(W) = \sum_{t,\omega} \alpha(\omega) \| R_{yy}(t, \omega) - \mathrm{diag}(R_{yy}(t, \omega)) \|_F^2$$

with the factorization $R_{yy}(t,\omega) \approx W(\omega) R_{xx}(t,\omega) W^H(\omega)$, applying a linear constraint to the algorithm to create filter coefficients, and filtering the composite signal based on the filter coefficients to separate said composite signal into a plurality of component signals, further comprising the step of choosing a linear constraint from a set of two linear constraints given by a first linear constraint diag(W(ω)D(ω, r))=I and a second linear constraint (W(ω)D(ω, r))=I wherein the above steps are performed using a computing system.

15. A method of separating a composite signal into a plurality of component signals comprising the steps of computing a cross power spectra $R_{yy}(t,\omega)$ of the plurality of component signals, simultaneously diagonalizing $R_{yy}(t,\omega)$ with an algorithm defined as:

$$J(W) = \sum_{t,\omega} \alpha(\omega) \| R_{yy}(t, \omega) - \mathrm{diag}(R_{yy}(t, \omega)) \|_F^2$$

with the factorization $R_{yy}(t,\omega) \approx W(\omega) R_{xx}(t,\omega) W^H(\omega)$, applying a linear constraint to the algorithm to create filter coefficients, and filtering the composite signal based on the filter coefficients to separate said composite signal into a plurality of component signals and applying a regularization term to the diagonalizing algorithm of $J(\omega) = \| \mathrm{diag}(W(\omega)D(\omega,r)) - I \|_F^2$ wherein the above steps are performed using a computing system.

* * * * *